(12) United States Patent  
Kamibeppu

(10) Patent No.: US 9,093,138 B2
(45) Date of Patent: Jul. 28, 2015

(54) NON-VOLATILE SEMICONDUCTOR MEMORY DEVICE

(71) Applicant: KABUSHIKI KAISHA TOSHIBA, Tokyo (JP)

(72) Inventor: Osamu Kamibeppu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,774

(22) Filed: Mar. 2, 2014

(65) Prior Publication Data

US 2015/0078109 A1    Mar. 19, 2015

(30) Foreign Application Priority Data

Sep. 13, 2013 (JP) .................................. 2013-190288

(51) Int. Cl.
*G11C 7/10* (2006.01)
*G11C 7/22* (2006.01)

(52) U.S. Cl.
CPC . *G11C 7/22* (2013.01); *G11C 7/222* (2013.01)

(58) Field of Classification Search
CPC ........................................................ G11C 7/22
USPC .......................................................... 365/193
See application file for complete search history.

(56) References Cited

U.S. PATENT DOCUMENTS

| 5,646,904 | A | 7/1997 | Ohno et al. |
| 7,409,473 | B2* | 8/2008 | Conley et al. .................... 710/38 |
| 8,072,826 | B2* | 12/2011 | Chang ............................ 365/193 |
| 8,473,811 | B2* | 6/2013 | Jo et al. .......................... 714/763 |
| 8,612,665 | B2* | 12/2013 | Jeon ................................ 711/103 |
| 2007/0233907 | A1* | 10/2007 | Yoshikawa et al. ............. 710/26 |
| 2010/0312981 | A1* | 12/2010 | Kajimura ....................... 711/167 |
| 2011/0087811 | A1 | 4/2011 | Kondo et al. |
| 2012/0278539 | A1* | 11/2012 | Hosogaya ...................... 711/103 |
| 2014/0173234 | A1* | 6/2014 | Jung et al. ..................... 711/162 |

FOREIGN PATENT DOCUMENTS

| JP | H08123717 A | 5/1996 |
| JP | 2003-173290 A | 6/2003 |
| JP | 2011081885 A | 4/2011 |

* cited by examiner

*Primary Examiner* — Son Mai
(74) *Attorney, Agent, or Firm* — Patterson & Sheridan, LLP

(57) ABSTRACT

A non-volatile semiconductor memory device includes a plurality of non-volatile memory elements, and a plurality of input/output circuits, each of which is connected to one of the non-volatile memory elements, and is configured to output first data from a corresponding non-volatile memory element synchronously with a first data strobe signal, and to input second data to a corresponding non-volatile memory element synchronously with a second data strobe signal. The second data strobe signal is delayed with respect to the first data strobe signal.

18 Claims, 8 Drawing Sheets

RECEIVING CYCLE OF COPY DESTINATION
HAS BEEN SHIFTED BY INTERNAL DELAY CIRCUIT

| Chip1 CE0&1 Select | Chip1 CE0 Select | | | Chip1 CE1 Select | | | Chip1 CE0&1 Select | | |
|---|---|---|---|---|---|---|---|---|---|
| Copy Com 1 | Read Add Com | Pellet0 Add | | Program Add Com | Pellet0 Add | | Copy Com 2 | Dout =Din | Copy Com 3 |

RECEIVING CYCLE OF COPY DESTINATION
HAS BEEN SHIFTED BY INTERNAL DELAY CIRCUIT

| Chip1/2 CE0 Select | Chip1 CE0 Select | | Chip2 CE0 Select | | Chip1/2 CE0 Select | | |
|---|---|---|---|---|---|---|---|
| Copy Com 1 | Read Add Com | Pellet0 Add | Program Add Com | Pellet0 Add | Copy Com 2 | Dout =Din | Copy Com 3 |

NON-VOLATILE SEMICONDUCTOR MEMORY DEVICE

CROSS-REFERENCE TO RELATED APPLICATION

This application is based upon and claims the benefit of priority from Japanese Patent Application No. 2013-190288, filed Sep. 13, 2013, the entire contents of which are incorporated herein by reference.

FIELD

Embodiments described herein relate generally to a non-volatile semiconductor memory device.

BACKGROUND

In order to increase capacity, in some non-volatile semiconductor memory devices, a plurality of memory chips are stacked and the stack of memory chips is stored in a package.

DESCRIPTION OF THE DRAWINGS

FIG. 1A is a block diagram of the non-volatile semiconductor memory device, and FIG. 1B is a circuit diagram illustrating a main portion of the non-volatile semiconductor memory device.

FIG. 2A is a block diagram illustrating the copy source and copy destination of the data, and FIG. 2B is a block diagram illustrating the sequence of the copying of the data.

FIG. 4A is a block diagram illustrating the copy source and copy destination of the data, and FIG. 4B is a block diagram illustrating the sequence of the copying of the data.

FIG. 5A is a block diagram illustrating the copy destination of the data, and FIG. 5B is a block diagram illustrating the sequence of the copying of the data.

FIG. 7A is a block diagram illustrating the copy source and copy destination of the data, and FIG. 7B is a block diagram illustrating the sequence of the copying of the data.

DETAILED DESCRIPTION

According to the embodiments, there is provided a non-volatile semiconductor memory device capable of copying data from a memory chip to another memory chip in a short period of time.

In general, according to one embodiment, a non-volatile semiconductor memory device includes a plurality of non-volatile memory elements, a plurality of input/output circuits, each of which is connected to one of the non-volatile memory elements and is configured to output first data from a corresponding non-volatile memory element synchronously with a first data strobe signal, and to input second data to a corresponding non-volatile memory element synchronously with a second data strobe signal. The second data strobe signal is delayed with respect to the first data strobe signal.

Hereinafter, the exemplary embodiments will be described with reference to the accompanying drawings.

First Embodiment

Figure 1A:
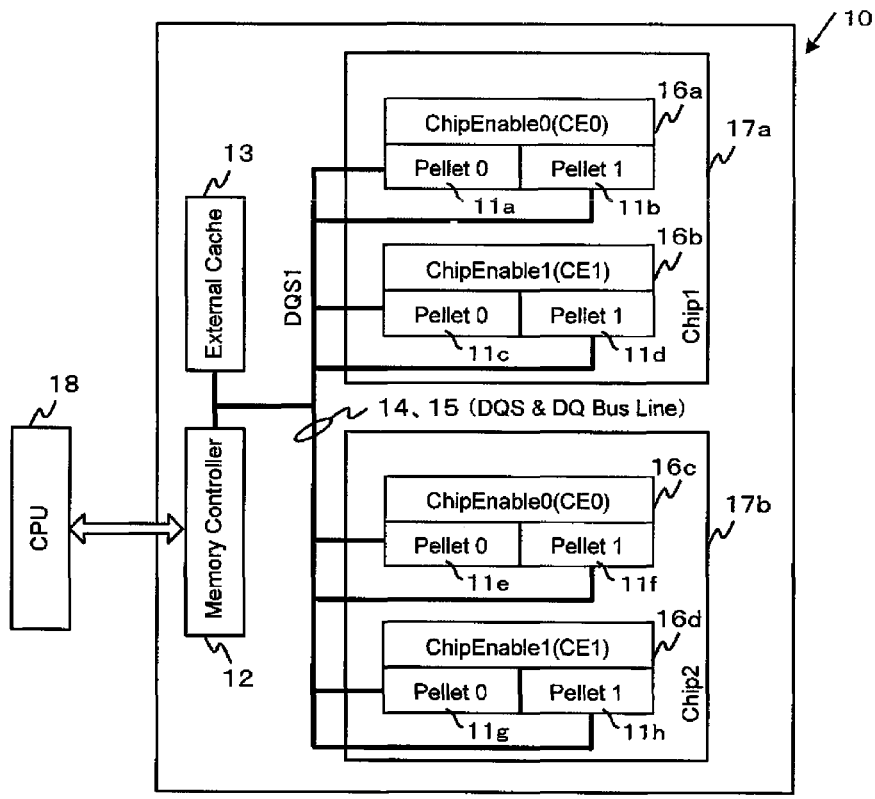
FIGS. 1A and 1B are diagrams illustrating a non-volatile semiconductor memory device according to a first embodiment, and more specifically.
Figure 1B:
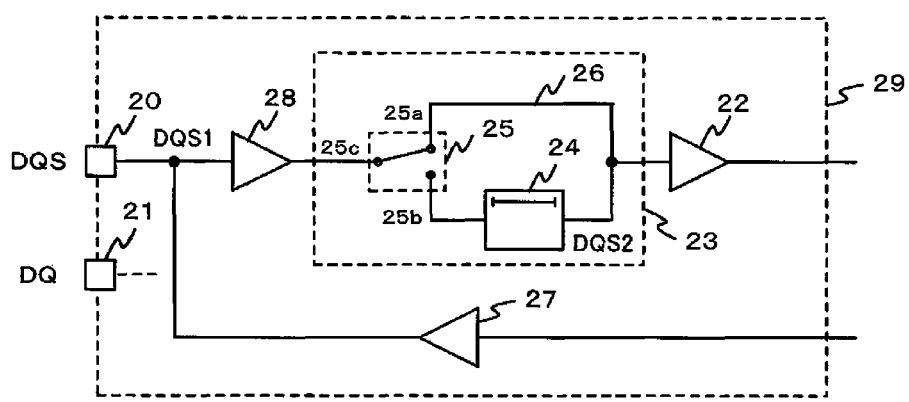
Figure 2A:
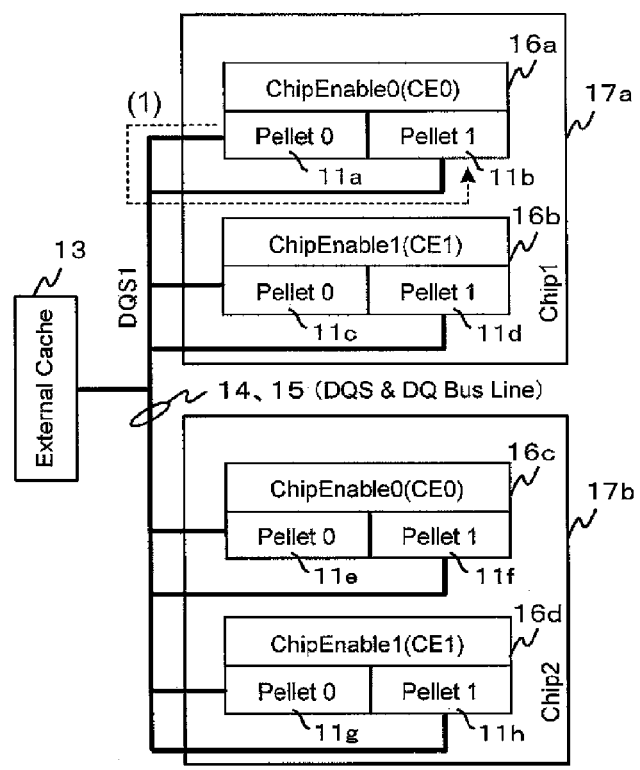
FIGS. 2A and 2B are block diagrams that illustrate copying of data according to the first embodiment, and more specifically.
Figure 2B:
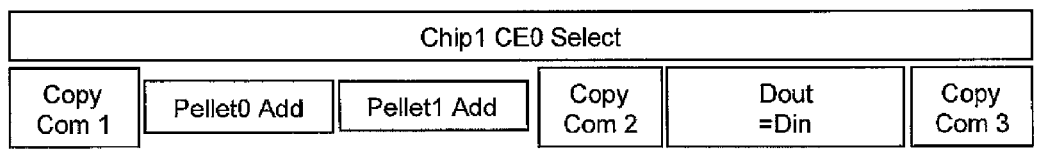
Figure 3:
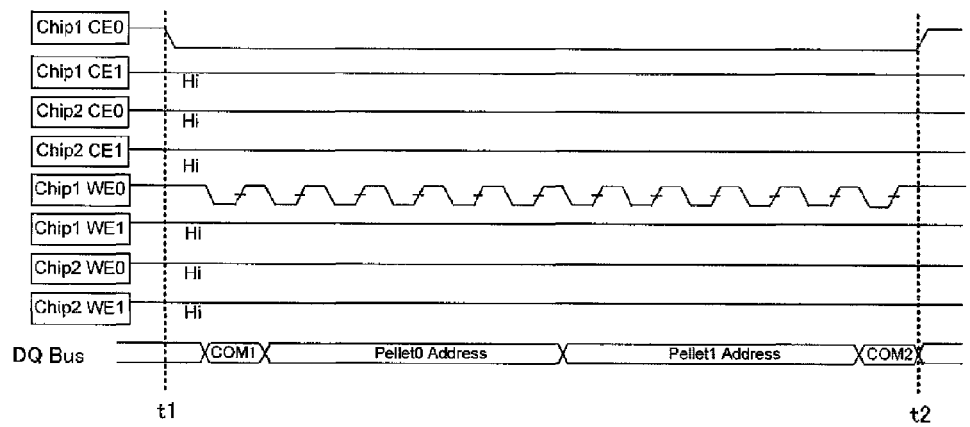
FIG. 3 is a timing chart illustrating the copying of the data according to the first embodiment.
Figure 3:
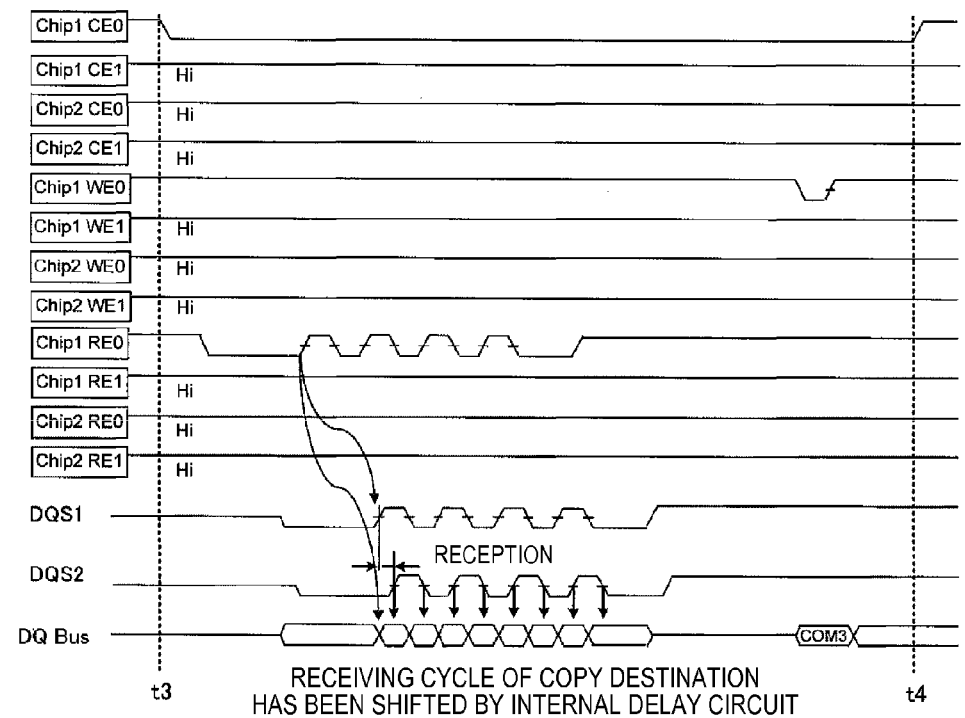

A non-volatile semiconductor memory device according to a first embodiment is described with reference to FIGS. 1A to 3. FIGS. 1A and 1B are diagrams illustrating the non-volatile semiconductor memory device according to the first embodiment, and more specifically, FIG. 1A is a block diagram of the non-volatile semiconductor memory device, and FIG. 1B is a circuit diagram illustrating a main portion of the non-volatile semiconductor memory device. FIGS. 2A and 2B are block diagrams illustrating copying of data, and more specifically, FIG. 2A is a block diagram illustrating the copy source and copy destination of the data, and FIG. 2B is a block diagram illustrating the sequence of the copying of the data. FIG. 3 is a timing chart illustrating the copying of the data.

As shown in FIG. 1A, the non-volatile semiconductor memory device 10 according to the first embodiment is, for example, a NAND flash memory. The non-volatile semiconductor memory device 10 includes a plurality of non-volatile memory elements 11, a memory controller 12 for controlling reading of data from the non-volatile memory elements 11, and writing of data into the non-volatile memory elements 11, and a cache memory 13 for temporarily storing data when reading of the data and writing of the data are performed.

The plurality of non-volatile memory elements 11, the memory controller 12, and the cache memory 13 are connected to one another by data strobe signal bus lines 14 and data signal bus lines 15. The data strobe signal bus lines 14 are, for example, two signal lines for bidirectionally transmitting a data strobe signal and an inverted data strobe signal. The data signal bus lines 15 are, for example, eight signal lines for bidirectionally transmitting an 8-bit data signal.

The plurality of non-volatile memory elements 11 is stacked to improve a packaging density and to increase capacity, and then is stored in one package (not shown).

The plurality of non-volatile memory elements 11 is grouped into a plurality of primary groups 16. The plurality of primary groups 16 is grouped into a plurality of secondary groups 17. Here, the non-volatile semiconductor memory device 10 includes two secondary groups 17. Each secondary group 17 includes two primary groups 16. Each primary group 16 includes two non-volatile memory elements 11.

In this disclosure, the non-volatile memory elements 11 are also referred to as pellets, and the secondary groups 17 are also referred to as chips. All of the non-volatile memory elements are referred to as non-volatile memory elements 11, and when the non-volatile memory elements need to be distinguished from one another, the non-volatile memory elements are denoted by reference symbols with suffixes added thereto, for example, a reference symbol "11a". This is similarly applied even with respect to the primary groups and the secondary groups.

The memory controller 12 controls reading of data from the non-volatile memory elements 11, and writing of data into the non-volatile memory elements 11, in response to commands from an external host 18, in embodiments, a central processing unit (CPU) of a personal computer. The memory controller 12 and the host 18 are connected, in embodiments, by a universal serial bus (USB).

Pellets 11 that are each capable of reading or writing data are described as follows. First, among the plurality of secondary groups 17, one secondary group 17 is selected. Next, among a plurality of primary groups 16 included in the selected secondary group 17, one primary group 16 is selected. Subsequently, among a plurality of pellets 11 included in the selected primary group 16, one pellet 11 is selected.

A pellet 11 designated for reading of data transmits a data strobe signal (a first data strobe signal DQS1) for notifying the memory controller 12 that the pellet is transmitting the data, to the data strobe signal bus lines (DQS bus lines) 14 while transmitting a data signal (a DQ signal) to the data signal bus lines (DQ bus lines) 15. The DQS signal is a predetermined clock signal.

A pellet 11 designated for writing of the data receives the DQS signal from the DQS bus lines 14, and receives the DQ signal from the DQ bus lines 15 at the rising and falling edges of a delayed signal (a second data strobe signal DQS2) of the received DQS signal.

Therefore, according to a sequence as described below, it is possible to write (copy) data read from one pellet 11 (a copy source), into another pellet 11 (a copy destination).

First, a first pellet 11a from which data is read, and a second pellet 11b into which the data is written are designated. From the first pellet 11a, the data is read. The first pellet 11a transmits a DQS signal and a DQ signal. The second pellet 11b receives the DQS signal, and receives the DQ signal from the DQ bus lines 15 at the rising and falling edges of a delayed signal of the received DQS signal.

Since the cycle of the DQS signal inside of the second pellet 11b is later than that of the DQS signal transmitted by the first pellet 11a, after the first pellet 11a starts to transmit the DQ signal, the second pellet 11b receives the DQ signal. The DQ signal is thus reliably input to the second pellet 11b.

FIG. 1B is a circuit diagram illustrating a circuit for delaying the cycle of a DQS signal. As shown in FIG. 1B, a pellet 11 includes a data strobe signal terminal (DQS terminal) 20 through which a DQS signal passes, and a data signal terminal (DQ terminal) 21 through which a DQ signal passes. The DQS terminal 20 is connected to the DQS bus lines 14. The DQ terminal 21 is connected to the DQ bus lines 15.

The pellet 11 includes a delay circuit 23 provided between the DQS terminal 20 and an input buffer 22 and which is capable of determining whether to delay the DQS signal received through the DQS terminal 20. The delay circuit 23 includes a delay element 24, and a switch 25 including three contact points 25a, 25b, and 25c.

In the delay element 24, for example, inverters of a predetermined number of stages are connected in series. The switch 25 includes, for example, two MOS transistors. The contact points 25a and 25c are usually connected, and contact points 25b and 25c are usually not connected.

When the contact points 25a and 25c are electrically connected to each other, the DQS terminal 20 and the input buffer 22 are connected directly to each other by a wiring line 26, and thus the DQS signal is not delayed. When the contact points 25b and 25c are electrically connected to each other, the DQS terminal 20 and the input buffer 22 are connected to each other through the delay circuit 23, and the DQS signal is delayed by a predetermined delay.

The DQS terminal 20 is also connected to an output buffer 27. A DQS signal to be transmitted through the DQS terminal 20 does not need to be delayed. In order to avoid interference between the delay circuit 23 and the output buffer 27, another buffer 28 may be provided between the DQS terminal 20 and the delay circuit 23.

The DQS terminal 20, the DQ terminal 21, the input buffer 22, the delay circuit 23, the output buffer 27, and the buffer 28 constitute an input/output circuit 29. The input/output circuit 29 is a portion of a peripheral circuit of the pellet 11.

The above described sequence will be described in detail. FIG. 2A shows the flows of a DQS signal and a DQ signal in a case of copying data between pellets 11 included in the same primary group 16, and is depicted in the figure by a broken line.

As shown in FIG. 2B, first, a primary group 16a included in a secondary group 17a (Chip1) is selected.

According to a copy command 1 (a first command), the address of a pellet 11a (a first non-volatile memory element) from which data is read, and the address of a pellet 11b (a second non-volatile memory element) into which the data is written are designated. Each address is, in embodiments, a 5-byte (40-bit) address including a 2-byte column address and a 3-byte row address.

According to a copy command 2 (a second command), the switch 25 is controlled such that the delay circuit 23 of the pellet 11b delays the DQS signal. The pellet 11a outputs the data (first data) together with the DQS signal. The pellet 11b receives the DQS signal, and uses a signal DQS2, which is generated by delaying the DQS signal by the delay circuit 23, in a writing cycle to receive the output data.

According to a copy command 3 (a third command), the switch 25 is controlled such that the delay circuit 23 does not delay the DQS signal while the received data (second data) is written in the pellet 11b.

Here, the copy command 1 is a command for the copying between the pellets, the copy command 2 is a read start command for the copying between the pellets, and the copy command 3 is a read end command for the copying between the pellets.

The above described sequence will be described in detail with reference to a timing chart. In FIG. 3, CE (Chip Enable) represents selection of a chip, and WE (Write Enable) represents enabling the receiving of commands and addresses, and RE (Read Enable) represents enabling reading of data.

Each of primary groups 16a, 16b, 16c, and 16d is selected when a corresponding CE terminal is at a low signal level. Each of Chip1 WE0, Chip1 WE1, Chip2 WE0, and Chip2 WE1 is enabled to receive commands and addresses while a predetermined clock signal is being input to a WE terminal configured therein. Each of Chip1 RE0, Chip1 RE1, Chip2 RE0, and Chip2 RE1 is enabled to be read while a predetermined clock signal is input to an RE terminal configured therein.

As shown in FIG. 3, between a time t1 and a time t2, Chip1 CE0 is at a low signal level. As a result, the primary group 16a is selected. To Chip1 WE0, a clock signal is input. While the clock signal is being input, the receipt of a DQ signal is made possible. To the DQ bus lines 15, the copy command 1, the address of a reading pellet, the address of a writing pellet, and the copy command 2 are sequentially transmitted. As a result, the pellet 11a is designated as the reading pellet, and the pellet 11b is designated as the writing pellet. The switch 25 is controlled such that the delay circuit 23 of the pellet 11b delays the DQS signal.

Between a time t3 and a time t4, Chip1 CE0 again is selected by a low signal level. As a result, the primary group 16a is selected. To Chip1 RE0, the clock signal is input. While the clock signal is being input, transmission of the DQS signal and the DQ signal is enabled.

Since the pellet 11a has been designated as the reading pellet, the DQS signal (DQS1) is transmitted to the DQS bus lines 14 while the DQ signal is transmitted to the DQ bus lines 15. Since the pellet 11b has been designated as the writing pellet, the pellet 11b receives the DQS signal. The pellet 11b delays the DQS signal by a predetermined amount, for example, about ⅛ to ½ of the cycle of the DQS signal inside, and receives the DQ signal at the rising and falling edges of the delayed signal DQS2 (in DQS buses inside of the copy destination).

Next, to Chip1 WE0, a clock signal is input. To the DQ bus lines 15, the copy command 3 is transmitted. As a result, the switch 25 is controlled such that the delay circuit 23 of the pellet 11b does not delay the DQS signal while the received data is written in the pellet 11b, and then the copying finishes.

Figure 4A:
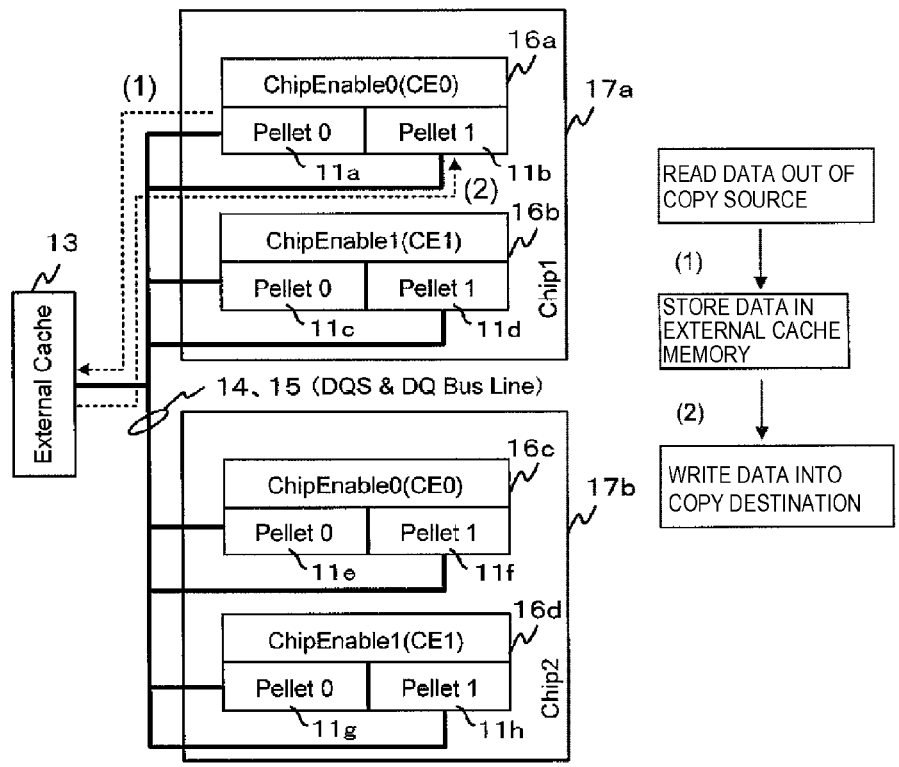
FIGS. 4A and 4B are block diagrams illustrating copying of data of a comparative example, and more specifically.
Figure 4B:
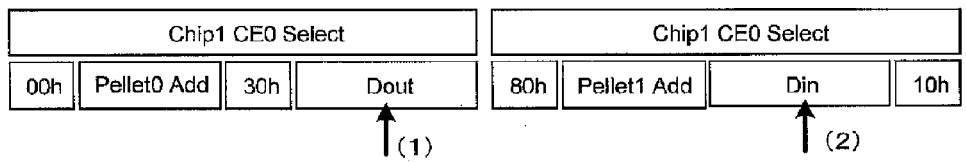

FIGS. 4A and 4B are block diagrams illustrating copying of data of a comparative example, and more specifically, FIG. 4A is a block diagram illustrating the copy source and copy destination of data, and FIG. 4B is a block diagram illustrating the sequence of the copying of the data.

As shown in FIG. 4A, in a case of copying data of the pellet 11a into the pellet 11b, in step (1), the data is read from the pellet 11a and is temporarily stored in the cache memory 13, and in step (2), the data stored in the cache memory 13 is written into the pellet 11b.

As shown in FIG. 4B, the primary group 16a is selected. A read address designation command (00h expressed as an 8-bit, hexadecimal numeral), and the address of the reading pellet are transmitted, and the pellet 11a from which data is read is designated. After a read enable command (30h), a predetermined clock signal is input to the RE terminal, whereby the data is read from the pellet 11a (Dout), and the read data is input to the cache memory 13.

Next, a write address designation command (80h) and the address of the writing pellet are transmitted, and the pellet 11b into which the data is written is designated. The clock signal is input to the DQS terminal, and the data is input from the cache memory 13 to the pellet 11b. According to a write enable command (10h), the input data is written in the pellet 11b.

In the comparative example, since the data is copied through the cache memory 13, the above described steps (1) and (2) are necessary. Meanwhile, in the present embodiment, since data is copied without passing through the cache memory 13, only the step (1) is needed. Therefore, it is possible to copy the data in a short time.

As described above, in the non-volatile semiconductor memory device 10 according to the present embodiment, each pellet 11 includes a delay circuit 23 capable of determining whether to delay the received DQS signal inside. If the pellet 11a from which data is read and the pellet 11b into which the data is written are designated in advance, and the data is read from the pellet 11a, the pellet 11b takes in the read data at the rising and falling edges of the delayed signal of the DQS signal.

As a result, the data read from the pellet 11a can be automatically written into the pellet 11b without passing through the cache memory 13. Therefore, it is possible to copy the data in a short time.

Here, a case where the non-volatile semiconductor memory device is a NAND flash memory has been described. However, the non-volatile semiconductor memory device is not limited to a NAND flash memory. The non-volatile semiconductor memory device need only be a storage device which receives and outputs data through the same terminal with reference to a DQS signal. Examples of the non-volatile semiconductor memory device include a magnetoresistive random access memory (MRAM), a resistance random access Memory (ReRAM), and so on. Technically, the exemplary embodiments are also applicable to a dynamic random access memory (DRAM) which is not non-volatile.

Second Embodiment

Figures 5A, 5B:
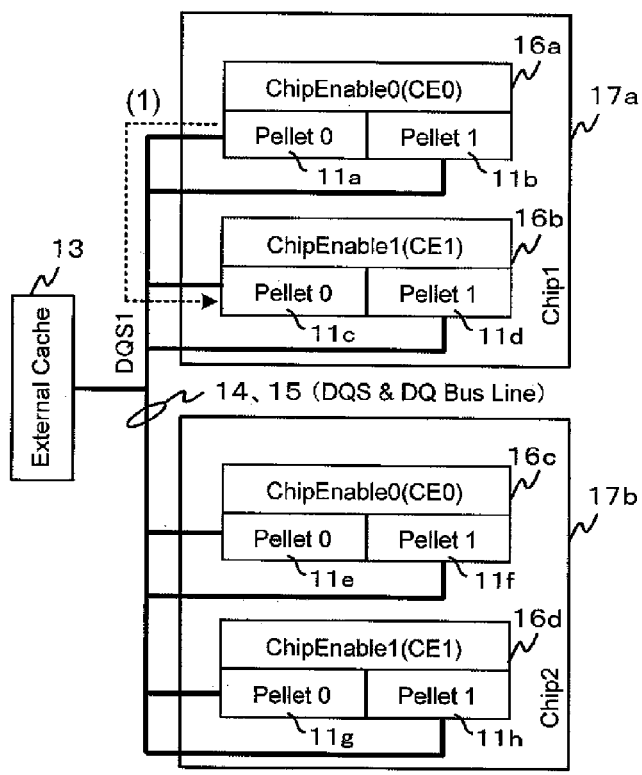
FIGS. 5A and 5B are block diagrams illustrating copying of data according to a second embodiment, and more specifically.
Figure 6:
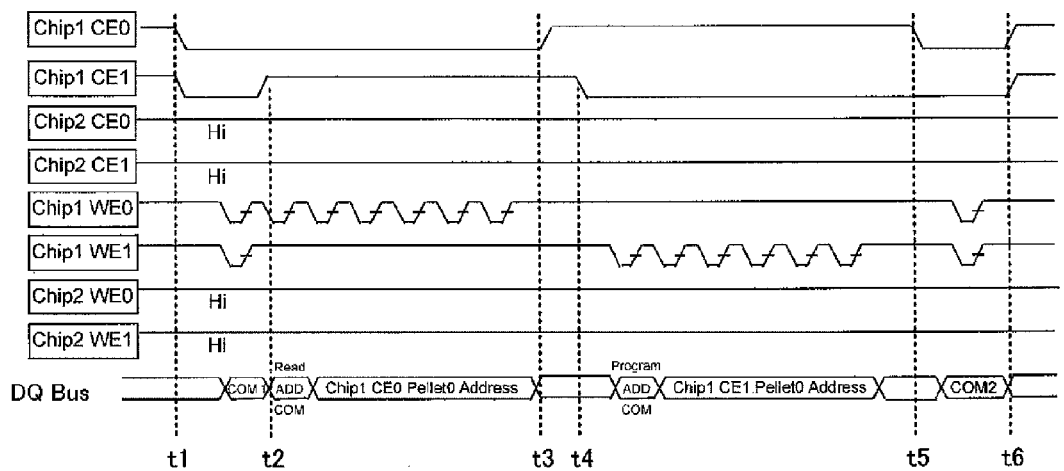
FIG. 6 is a timing chart illustrating the copying of the data according to the second embodiment.
Figure 6:
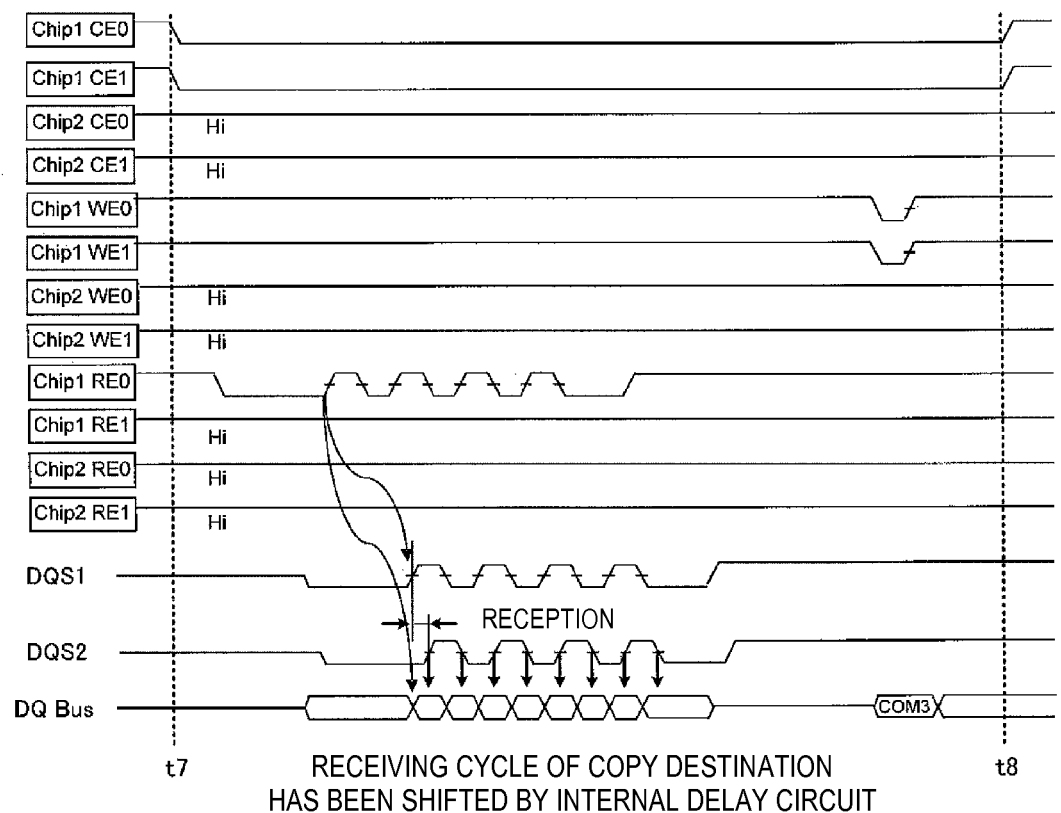

A non-volatile semiconductor memory device according to a second embodiment will be described with reference to FIGS. 5A, 5B, and 6. FIGS. 5A and 5B are block diagrams illustrating copying of data. More specifically, FIG. 5A is a block diagram illustrating the copy source and copy destination of the data, and FIG. 5B is a block diagram illustrating the sequence of the copying of the data. FIG. 6 is the timing chart of the copying of the data.

In the present embodiment, components identical to those of the above described first embodiment are denoted by the same reference symbols, and will not be described, and different portions will be described. The present embodiment is different from the first embodiment in that the copy destination of data is a non-volatile memory element in a primary group included in the secondary group that includes the copy source of the data, but is in a different primary group than the copy source.

As shown in FIG. 5A, a pellet from which data is read is the pellet 11a of the primary group 16a included in a chip 17a. A pellet into which the data is written is a pellet 11c of a primary group 16b included in the same chip 17a.

As shown in FIG. 5B, first, the primary group 16a and the primary group 16b are selected, and the copy command 1 is transmitted. The primary group 16a is selected, and a read address command and the address of the pellet from which the data is read are transmitted. The primary group 16b is selected, and a program address command and the address of the pellet into which the data is written are transmitted. As a result, the pellet 11a is designated as the data reading pellet, and the pellet 11c is designated as the data writing pellet.

Next, the primary group 16a and the primary group 16b are selected, and if the data is read from the pellet 11a according to the copy command 2, the read data is input to the pellet 11c. According to the copy command 3, the input data is written in the pellet 11c, and then the copying finishes.

As shown in FIG. 6, between a time t1 and a time t2, Chip1 CE0 and Chip1 CE1 are at low signal levels, and the primary group 16a and the primary group 16b are selected. In the meantime, the clock signal is input to the Chip1 WE0 and Chip1 WE1, and the primary group 16a and the primary group 16b are enabled to receive commands, and receive the copy command 1.

Between the time t2 and a time t3, Chip1 CE0 is at the low signal level, the primary group 16a is selected. In the meantime, the clock signal is input to Chip1 WE0, and thus the primary group 16a is enabled to receive commands and addresses, and subsequently receives the read address command and the address of the pellet from which the data is read.

Between a time t4 and a time t5, Chip1 CE1 is at the low signal level, and the primary group 16b is selected. In the meantime, the clock signal is input to Chip1 WE1, and thus the primary group 16b is enabled to receive commands and addresses, and receives the program address command and the address of the pellet into which the data is written.

Between the time t5 and a time t6, both of Chip1 CE0 and Chip1 CE1 are at the low signal levels, and thus the primary group 16a and the primary group 16b are selected. In the meantime, the clock signal is input to Chip1 WE0 and Chip1

WE1, and thus the primary group 16a and the primary group 16b are enabled to receive commands and addresses, and receive the copy command 2.

Between a time t7 and a time t8, both of Chip1 CE0 and Chip1 CE1 are at the low signal levels, and thus the primary group 16a and the primary group 16b are selected. Timings between the time t7 and the time t8 are substantially the same as those between the time t3 and the time t4 shown in FIG. 3. A difference is that the clock signal is input to Chip1 WE0 and Chip1 WE1, and thus the primary group 16a and the primary group 16b are enabled to receive commands and addresses and receive the copy command 3.

As described above, according to the present embodiment, it is possible to copy data between non-volatile memory elements 11 of different primary groups 16 included in the same secondary group 17 in a short time.

Third Embodiment

Figures 7A, 7B:
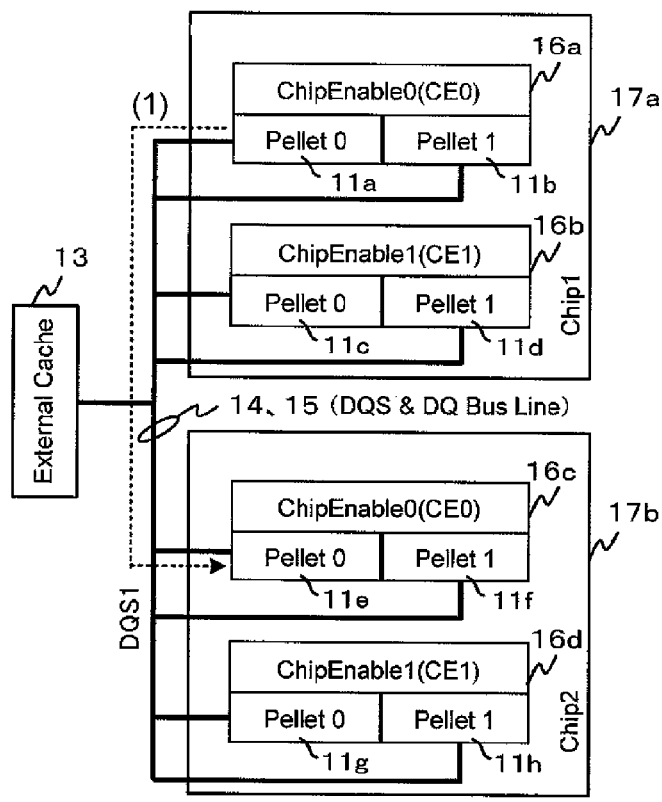
FIGS. 7A and 7B are block diagrams illustrating copying of data according to a third embodiment, and more specifically.
Figure 8:
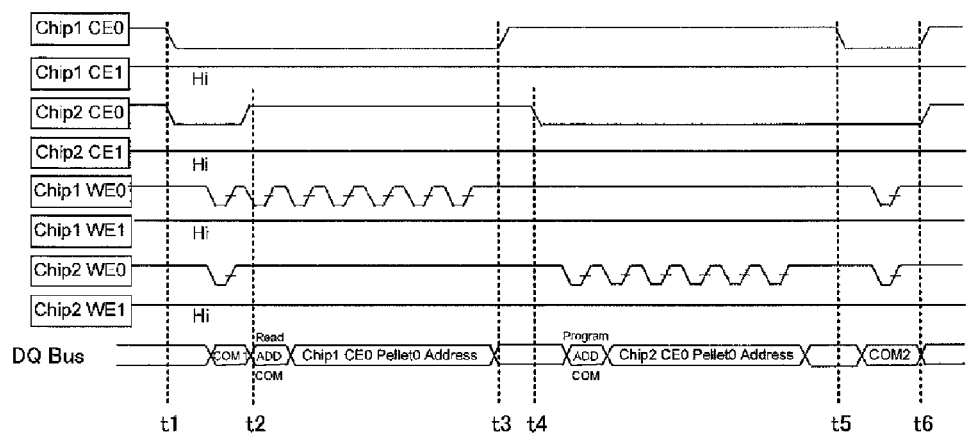
FIG. 8 is a timing chart illustrating the copying of the data according to the third embodiment.
Figure 8:
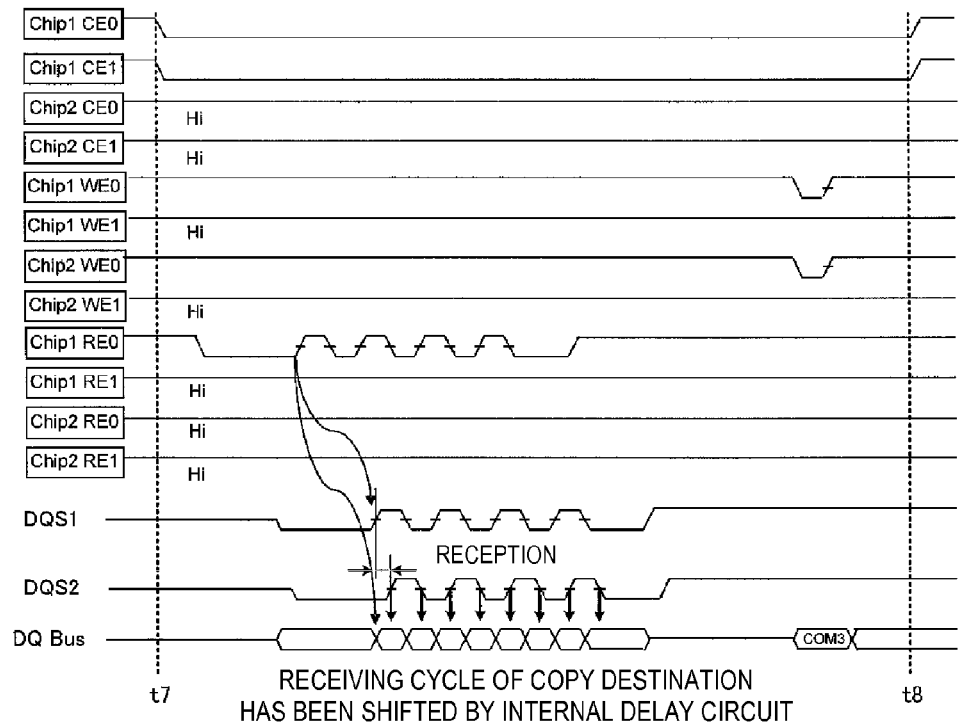

A non-volatile semiconductor memory device according to a third embodiment will be described with reference to FIGS. 7A, 7B, and 8. FIGS. 7A and 7B are block diagrams illustrating copying of data. More specifically, FIG. 7A is a block diagram illustrating the copy source and copy destination of the data, and FIG. 7B is a block diagram illustrating the sequence of the copying of the data. FIG. 8 is a timing chart illustrating the copying of the data.

In the present embodiment, components identical to those of the above described first embodiment are denoted by the same reference symbols, and will not be described, and different portions will be described. The present embodiment is different from the first embodiment in that the copy destination of data is a non-volatile memory element of any one primary group included in a secondary group different from the secondary group of the copy source of the data.

As shown in FIG. 7A, a pellet from which the data is read is the pellet 11a of the primary group 16a included in the chip 17a. A pellet into which the data is written is a pellet 11e of the primary group 16c included in a different chip 17b.

As shown in FIG. 7B, first, the primary group 16a and the primary group 16c are selected, and the copy command 1 is transmitted. The primary group 16a is selected, and the read address command and the address of the pellet from which the data is read are transmitted. The primary group 16c is selected, and the program address command and the address of the pellet into which the data is written are transmitted. As a result, the pellet 11a is designated as the data reading pellet, and the pellet 11e is designated as the data writing pellet.

Next, the primary group 16a and the primary group 16c are selected, and if the data is read from the pellet Ha according to the copy command 2, the data read is input to the pellet 11e. According to the copy command 3, the input data is written in the pellet 11e, and then the copying finishes.

As shown in FIG. 8, between a time t1 and a time t2, Chip1 CE0 and Chip2 CE0 are at low signal levels, and the primary group 16a and the primary group 16c are selected. In the meantime, the clock signal is input to the Chip1 WE0 and Chip2 WE0, and the primary group 16a and the primary group 16c are enabled to receive commands and addresses, and receive the copy command 1.

Between the time t2 and a time t3, Chip1 CE0 is at the low signal level, the primary group 16a is selected. In the meantime, the clock signal is input to Chip1 WE0, and thus the primary group 16a is enabled to receive commands and addresses, and receives the read address command and the address of the pellet from which the data is read.

Between a time t4 and a time t5, Chip2 CE0 is at the low signal level, and the primary group 16c is selected. In the meantime, the clock signal is input to Chip2 WE0, and thus the primary group 16c is enabled to receive commands and addresses, and receives the written address command and the address of the pellet into which the data is written.

Between the time t5 and a time t6, both of Chip1 CE0 and Chip2 CE0 are at the low signal levels, and thus the primary group 16a and the primary group 16c are selected. In the meantime, the clock signal is input to Chip1 WE0 and Chip2 WE0, and thus the primary group 16a and the primary group 16c are enabled to receive commands and addresses, and receive the copy command 2.

Between a time t7 and a time t8, both of Chip1 CE0 and Chip2 CE0 are at the low signal levels, and thus the primary group 16a and the primary group 16c are selected. Timings between the time t7 and the time t8 are substantially the same as those between the time t3 and the time t4 shown in FIG. 3. A difference is that the clock signal is input to Chip1 WE0 and Chip2 WE0, and thus the primary group 16a and the primary group 16c are enabled to receive commands and receive the copy command 3.

As described above, according to the present embodiment, it is possible to copy data between non-volatile memory elements 11 of primary groups 16 included in different secondary groups 17 in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
   a plurality of non-volatile memory elements including a first non-volatile memory element and a second non-volatile memory element; and
   a plurality of input/output circuits including a first input/output circuit, which is a peripheral circuit of the first non-volatile memory element, and a second input/output circuit, which is a peripheral circuit of the second non-volatile memory element, wherein
   the first input/output circuit is configured to generate a first data strobe signal upon receiving a copy command that designates an address of the first non-volatile memory element as a copy source address and to output data from the first non-volatile memory element synchronously with the first data strobe signal, and
   the second input/output circuit is configured to receive the first data strobe signal, to generate a delayed, second data strobe signal from the first data strobe signal, and to input the data to the second non-volatile memory element synchronously with the second data strobe signal.

2. The non-volatile semiconductor memory device of claim 1, wherein the non-volatile memory elements are commonly connected to a data bus through which the data being copied are transmitted between the first and second non-volatile memory elements.

3. The non-volatile semiconductor memory device of claim 2, wherein the non-volatile memory elements are commonly connected to a data strobe signal bus and the first data strobe signal is output to the data strobe signal bus.

4. The non-volatile semiconductor memory device of claim 3, wherein each of the input/output circuits is configured to receive the first data strobe signal from the data strobe signal bus, and to generate the second a delayed data strobe signal therefrom.

5. The non-volatile semiconductor memory device of claim 4, wherein each of the input/output circuits includes a delay switch having first and second positions, the delayed data strobe signal being generated from the first data strobe signal when the delay switch is in the second position.

6. The non-volatile semiconductor memory device of claim 1, wherein the second data strobe signal is delayed by one-quarter cycle with respect to the first data strobe signal.

7. A method of copying data between non-volatile semiconductor memory elements, comprising:
  designating source and target non-volatile semiconductor memory elements;
  generating a first data strobe signal by the source non-volatile semiconductor memory element and outputting data synchronously with the first data strobe signal from the source non-volatile semiconductor memory element; and
  generating a second data strobe signal by the target non-volatile semiconductor memory element and inputting the data synchronously with the second data strobe signal to the target non-volatile semiconductor memory element,
  wherein the second data strobe signal is delayed with respect to the first data strobe signal.

8. The method of claim 7, wherein the first strobe signal is generated in response to receiving a copy command.

9. The method of claim 7, further comprising delaying the second strobe signal with respect to the first data strobe signal.

10. The method of claim 7, wherein first and second groups of the non-volatile semiconductor memory elements are integrated onto a single chip, and the source and target non-volatile memory elements are in the first group.

11. The method of claim 10, further comprising:
  issuing a read enable signal to the first group; and
  reading the data from the source non-volatile memory element synchronously with the first data strobe signal.

12. The method of claim 11, further comprising writing the data to the target non-volatile memory element synchronously with the second data strobe signal.

13. The method of claim 7, wherein first and second groups of the non-volatile semiconductor memory elements are integrated onto a single chip, and the source non-volatile memory element is in the first group and the second non-volatile memory element is in the second group.

14. The method of claim 13, wherein:
  a first group of the non-volatile semiconductor memory elements is integrated onto a first chip;
  a second group of the non-volatile semiconductor memory elements is integrated onto a second chip;
  the source non-volatile memory element is in the first group; and
  the target non-volatile memory element is in the second group.

15. A non-volatile semiconductor memory device comprising:
  a plurality of non-volatile memory elements including first and second non-volatile memory elements; and
  a memory controller that transmits a first command to designate the first non-volatile memory element as a source non-volatile memory element and the second non-volatile memory element as a target non-volatile memory element, wherein
  the first non-volatile memory element is configured to generate a first data strobe signal onto a data strobe signal bus and data onto a data bus synchronously with the first data strobe signal in response to a second command from the memory controller, and
  the second non-volatile memory element is configured to receive the first data strobe signal from the data strobe signal bus, generate a second data strobe signal that is delayed with respect to the first data strobe signal, and input the data from the data bus synchronously with the second data strobe signal, in response to the second command from the memory controller.

16. The non-volatile semiconductor memory device of claim 15, wherein the second command causes the second non-volatile memory element to delay the second data strobe signal with respect to the first data strobe signal.

17. The non-volatile semiconductor memory device of claim 16, wherein the second non-volatile memory element is configured to reset the second data strobe signal in response to a third command from the memory controller.

18. The non-volatile semiconductor memory device of claim 16, wherein the second data strobe signal is delayed by one-quarter cycle with respect to the first data strobe signal.

* * * * *